(12) United States Patent
Carney

(10) Patent No.: US 9,252,804 B2
(45) Date of Patent: Feb. 2, 2016

(54) RE-ALIGNING A COMPRESSED DATA ARRAY

(71) Applicant: International Business Machines Corporation, Armonk, NY (US)

(72) Inventor: Stuart E. Carney, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 571 days.

(21) Appl. No.: 13/745,556

(22) Filed: Jan. 18, 2013

(65) Prior Publication Data

US 2014/0208053 A1    Jul. 24, 2014

(51) Int. Cl.

| G06F 12/00 | (2006.01) |
|---|---|
| G06F 9/26 | (2006.01) |
| G06F 9/34 | (2006.01) |
| H03M 7/30 | (2006.01) |
| G06F 9/45 | (2006.01) |
| G06F 9/30 | (2006.01) |

(52) U.S. Cl.
CPC .......... *H03M 7/3068* (2013.01); *G06F 8/4434* (2013.01); *G06F 9/30178* (2013.01); *H03M 7/30* (2013.01); *H03M 7/3059* (2013.01)

(58) Field of Classification Search
CPC ... G06F 12/02; G06F 8/4434; G06F 9/30178; H03M 7/3068; H03M 7/3059; H03M 7/30
USPC .......... 711/200, 201; 717/128; 707/693, 791, 707/801; 712/10, 11, 14, 16, 18; 726/22–25
See application file for complete search history.

(56) References Cited

U.S. PATENT DOCUMENTS

| 3,587,047 A | 6/1971 | Cutaia | |
|---|---|---|---|
| 2009/0030960 A1* | 1/2009 | Geraghty | H03M 7/30 708/203 |
| 2013/0054546 A1* | 2/2013 | Solihin | G06F 12/0223 707/693 |

FOREIGN PATENT DOCUMENTS

EP    2424242    2/2012

OTHER PUBLICATIONS

Abadi, Daniel J. et al., "Integrating Compression and Execution in Column-Oriented Database Systems", SIGMOD dna@csail.mit.edu; madden@csail.mit.edu; mferreira@alum.mit.edu 2006, 12 pages.

(Continued)

*Primary Examiner* — Sanjiv Shah
*Assistant Examiner* — Shane Woolwine
(74) *Attorney, Agent, or Firm* — DeLizio Law, PLLC

(57) ABSTRACT

Some embodiments include an apparatus and a computer program product configured to re-align two-dimensional compressed data sets while preserving compression of the data. A set of one or more shifts and a corresponding set of one or more first dimension indices into a two-dimensional compressed data set for re-aligning the two-dimensional compressed data set are determined. Impact of re-aligning upon each vector in the second dimension of the two-dimensional compressed data set is determined while the two-dimensional compressed data set remains compressed. New compressed vectors are created in the second dimension resulting from re-aligning. Compression information is modified for each of the original vectors of the two-dimensional compressed data set that remain after re-aligning based, at least in part, on the new compressed vectors. A re-aligned version of the two-dimensional compressed data set is created with the new compressed vectors, and the remaining original vectors with their modified compression information.

9 Claims, 15 Drawing Sheets

(56) References Cited

OTHER PUBLICATIONS

Bentley, Jon L. et al., "A Locally Adaptive Data Compression Scheme", IP.com No. IPCOM000150175D Jul. 31, 1985, 33 pages.

Zhang, Li-Bao et al., "New Regions of Interest Image Coding Using Up-Down Bitplanes Shift for Network Applications", IFIP International Conference, NPC 2004, Wuhan, China, Oct. 18-20, 2004. Proceedings 2004.

* cited by examiner

FIG. 7

RE-ALIGNING A COMPRESSED DATA ARRAY

BACKGROUND

Embodiments of the inventive subject matter generally relate to the field of data processing, and, more particularly, to shifting elements of a compressed array while maintaining compression.

Processors designed with trace capabilities capture information about a variety of aspects to aid in error analysis/validation of hardware and/or software debugging. The trace hardware captures data of various types and from various sources that can include cores, cache, a branch predictor, arithmetic logic unit, ports, buses, etc. The information is captured from this variety of sources at defined intervals (e.g., every cycle, half cycle, etc.) and stored in on-chip structures, sometimes referred to as trace arrays. This information is collected over periods of time that can span millions of cycles. The combination of fine granularity in the information and large collection periods yields a large amount of data to be captured in the trace arrays.

The data is written into the trace arrays in accordance with designated starts and stops with continuous writing in a round-robin fashion. Compression values are used limit consumption of storage space to unique non-repeating data. The trace data is read out for analysis in compressed form either periodically or responsive to requests or commands.

SUMMARY

Embodiments of the inventive subject matter include an apparatus and/or a computer program product including computer usable program code configured to determine a maximum shift value of a set of one or more shift values for re-aligning a two-dimensional data set. Each of the set of one or more shift values indicates shifts at a specified index into a first dimension of the two-dimensional data set. The two-dimensional data set is compressed along the first dimension. For each of the second dimension vectors of the two-dimensional data set, it is determined whether shifting for each of the set of one or more shift values at the specified index into the first dimension of the second dimension vector results in a different vector than either a previously created vector or the second dimension vector. If shifting results in the different vector, the different vector is added to a re-aligned array. If shifting does not result in the different vector, a compressed form of the second dimension vector is incorporated into the re-aligned data set.

Embodiments of the inventive subject matter include an apparatus and/or a computer program product including computer usable program code configured to determine a set of one or more shifts and a corresponding set of one or more first dimension indices into a two-dimensional compressed data set for re-aligning the two-dimensional compressed data set. Impact of re-aligning upon each vector in the second dimension of the two-dimensional compressed data set is determined while the two-dimensional compressed data set remains compressed. New compressed vectors are created in the second dimension resulting from re-aligning. Compression information is modified for each of the original vectors of the two-dimensional compressed data set that remain after re-aligning based, at least in part, on the new compressed vectors. A re-aligned version of the two-dimensional compressed data set is created with the new compressed vectors, and the remaining original vectors with their modified compression information.

BRIEF DESCRIPTION OF THE DRAWINGS

The present embodiments may be better understood, and numerous objects, features, and advantages made apparent to those skilled in the art by referencing the accompanying drawings.

FIGS. 6 and 7 depict a conceptual diagram of an example merger of compressed data arrays of different sizes while preserving compression.

FIG. 10 depicts the operations that continue from block 903 of FIG. 9. FIG. 11 depicts the operations that continue from block 1001 of FIG. 10.

DESCRIPTION OF EMBODIMENT(S)

Figure 1:
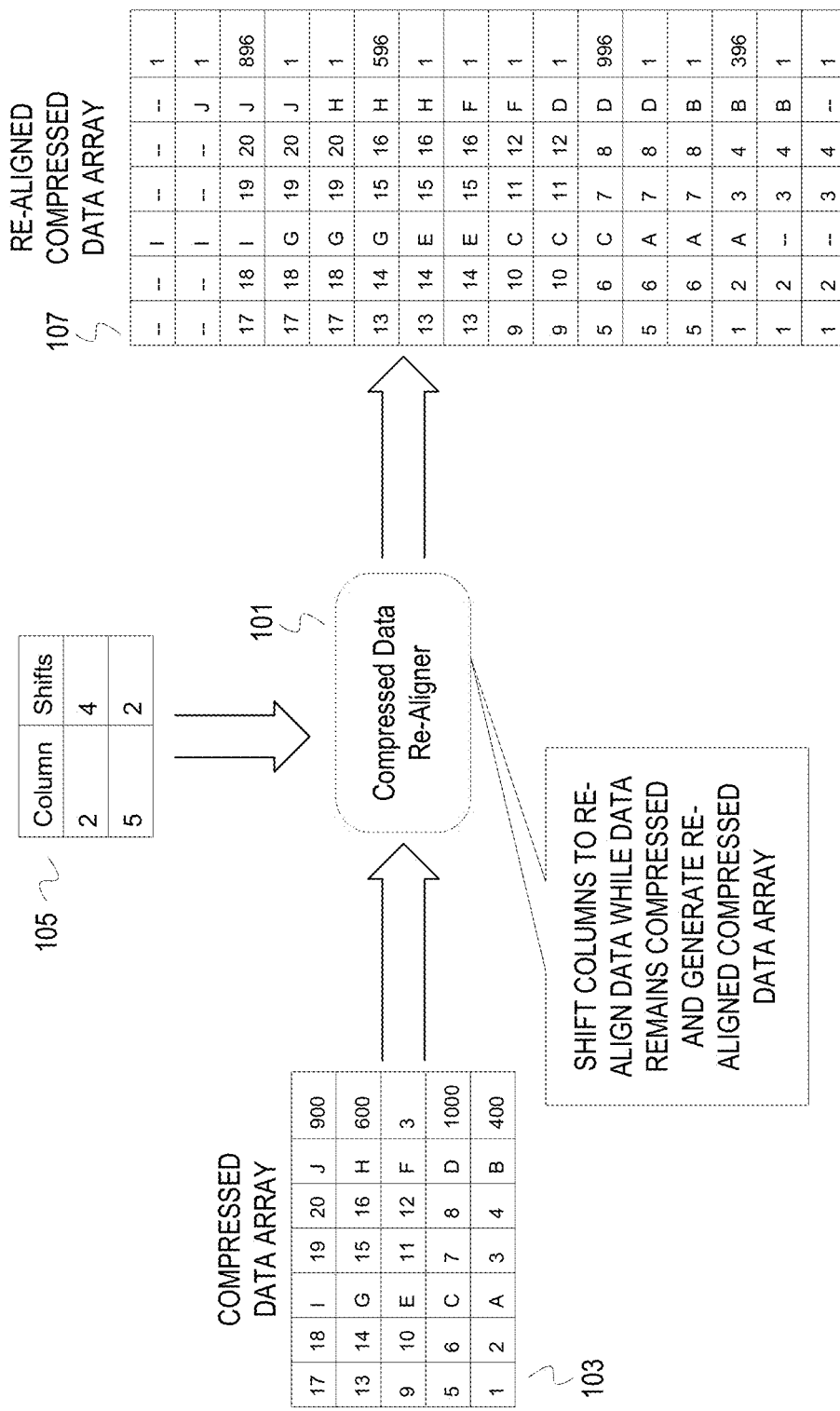
FIG. 1 depicts a conceptual diagram of re-aligning an example data array while the data array remains compressed.

The description that follows includes exemplary systems, methods, techniques, instruction sequences and computer program products that embody techniques of the present inventive subject matter. However, it is understood that the described embodiments may be practiced without these specific details. In other instances, well-known instruction instances, protocols, structures and techniques have not been shown in detail in order not to obfuscate the description.

Terminology

The following description uses some terms that are sometimes incorrectly construed by other parties and/or have been granted multiple meanings dependent upon context. In particular, this description refers to data arrays and vectors. When referring to a data array in this description, the term is not limited to an particular program language specific incarnation of an "array." The term "array" is used herein to refer to a data set that can logically be structured or perceived as having 2 dimensions regardless of how the data set is actually represented in hardware. As an example, an array defined in code as being 5×10 is allocated 50 contiguous units of memory. When this description refers to a vector in a data array, the term vector refers to the data elements of a single dimension of a data array. For instance, this description uses data arrays that include data elements with compression information at the end of each row. When describing evaluating a vector to determine whether it repeats, for example, the "vector" only refers to the data elements and not the specific structural aspect (e.g., column or row) of the data array. Implementations of the data array can vary. For instance, a program can define an object as comprising an array dimension1 of size N and an integer member variable (repeat) to count repeating sequences of the bits, values, or symbols that will be stored in the array dimension1. The program can then define an array trace_array of the array dimension1 having a size M. Assuming dimension1 corresponds (conceptually) to rows, trace_array can be visualized as a matrix of M rows (i.e., instances of dimension1) with N columns that do not include a column for the compression information because the compression information is accessed as a member (e.g., trace_array[x]·repeat).

Overview for Re-Aligning Compressed Data Arrays

In the context of trace data, the trace data may be affected by delays. To correct for the delays, the delayed data could be shifted. But the compressed representation of the trace data obscures how to re-align the trace data. For a 2-dimensional array of input data ("input array") with one dimension corresponding to time and the other dimension corresponding to a different aspect of the data (e.g., source, type, etc.), the data array is efficiently traversed to generate a re-aligned data array with new vectors separated from repeating vectors due to the shift while preserving a majority of the shifting. The traversal, re-alignment, and generation of the re-aligned data array is efficient since the re-aligning works upon the compressed data array instead of unraveling millions of cycles of data.

Re-Aligning Compressed Data Arrays

FIG. 1 depicts a conceptual diagram of re-aligning an example data array while the data array remains compressed. In FIG. 1, a compressed 5×6 compressed data array 103 is depicted. For this illustration, each uncompressed row would correspond to a defined time interval (e.g., clock cycle). The data array 103 is also depicted with compression information at the end (far right) of each row. The count of repeats for each row from bottom to top is as follows: 400, 1000, 3, 600, 900. Since the compression information counts sequential repeats of a vector, the number of sequential occurrences is the repeat count plus one. For instance, a repeat count of 0 for a row indicates that the row of values occurred once. The values depicted in the compressed data array 103 include unique letters and numbers to aid in illustrating the separation of rows that occurs from the re-alignment shifting.

A compressed data re-aligner 101 is depicted as processing the compressed data array 103 based on shifting information 105. The shifting information identifies which column to shift and a number of shifts for those columns. The shifting information 105 identifies two columns to shift: column 2 and column 5 (assuming the first is column 0). Column 2 is to be shifted 4 times and column 5 is to be shifted 2 times. For this example, the shifting is up. Assuming they dimension corresponds to time and the top of the data array is the oldest vector, shifting up corrects for delayed data. In the context of shifting up, the compressed data re-aligner 101 begins processing each row of the compressed data array 103 from bottom to top.

The re-aligner 101 shifts columns to re-align data while the data array 103 remains compressed and generates a re-aligned compressed data array 107. The re-aligner 101 shifts in null values into rows beyond the bounds of the time span covered by the compressed data array 103. In this example, the compressed data array 103 spans 2908 time intervals. As seen in a resulting re-aligned compressed data array 107, the number of vectors increased to accommodate the shifts and new vector sequences realized from the shifting, but compression has been preserved for many of the vectors. For instance, the vector {5, 6, C, 7, 8, D} has been reduced by 4 repeats due to shifting, but still represents 997 instances (i.e., 996 repeats) into a single vector of the data array 107. The shifting has also resulted in null values inserted into the shifted columns in the first 2 vectors of the array 107, and the last 2 vectors of the array 107. The last two vectors of the array 107 represent 4 additional time intervals (i.e., the top 2 rows that each repeat once) that the array 107 has expanded to cover cycles further back in time due to the shifting.

Figure 2:
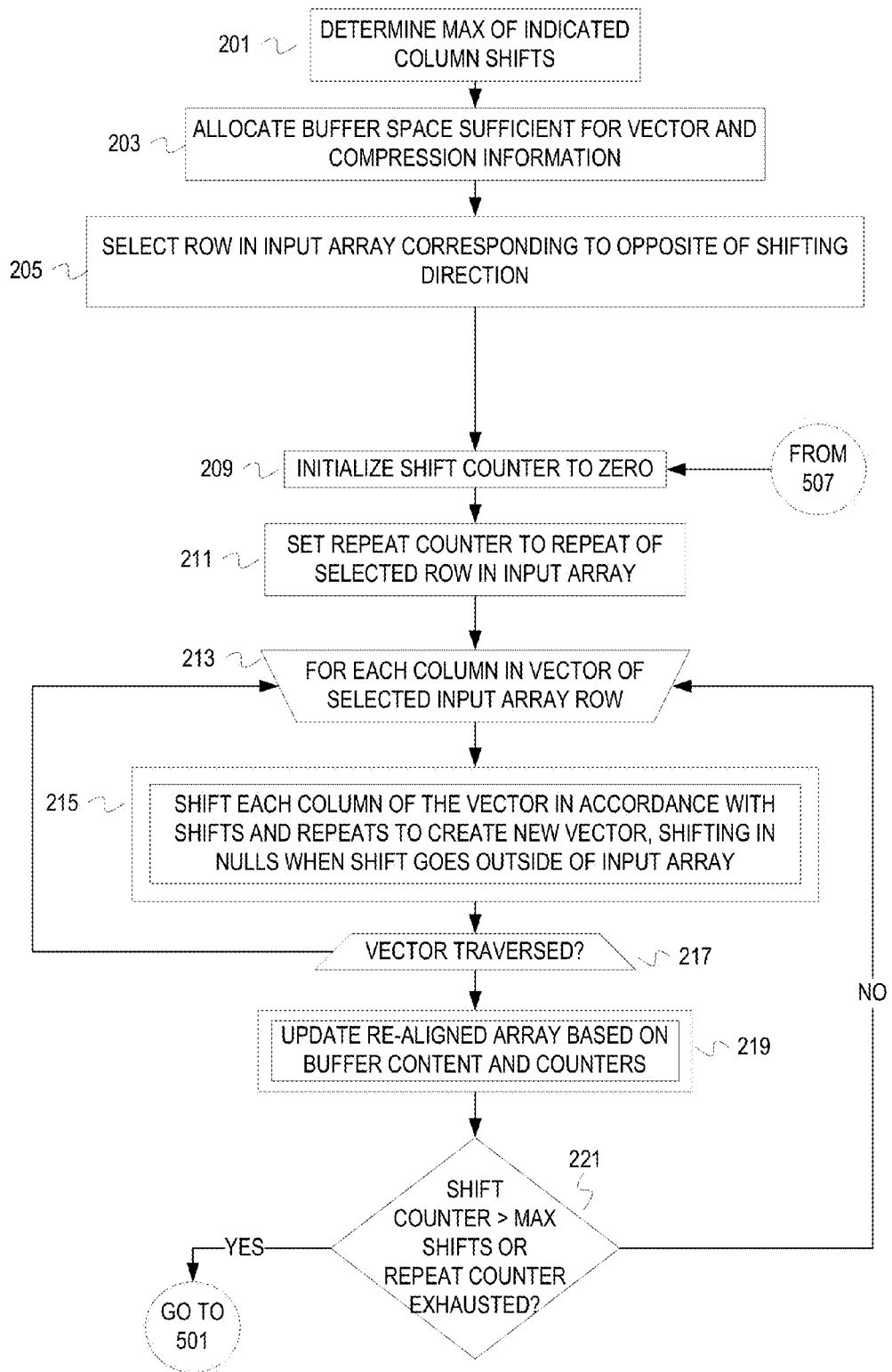
FIG. 2 depicts a flowchart of example operations for re-aligning a compressed data array.

FIG. 2 depicts a flowchart of example operations for re-aligning a compressed data array. At block 201, a maximum of indicated column shifts is determined. In the context of trace data, events that impacted when data was captured for particular sources of the data, for example, are detected and the appropriate number of shifts to correct for those events are determined and input into a process or module re-aligning the compressed data. The maximum shift of these shifts governs the number of times a same vector is accessed in the input compressed data array.

At block 203, buffer space is allocated sufficient to host a vector and compression information. In the context of a two dimensional array with dimension y representing time and data compressed across time, a re-aligner allocates a buffer space corresponding to the size of dimension x of the two dimensional array and space sufficient for the compression information if not represented in the size of dimension x.

At block 205, a row in the input array that corresponds to the opposite of the shifting direction is selected. For example, a bottom row is selected is shifting up. A top row is selected is shifting down.

At block 209, a shift counter is initialized to zero. The shift counter is used to limit reading of a vector of the input array to the maximum shift and track each shift. The shift counter counts each shift within a row, and if needed, with each next row, until either reaching the maximum number of shifts or exhausting all repeats for the current input vector row of data.

At block 211, a repeat counter is set to the repeat value of the selected row of the input array. The repeat counter is reduced each time shifting impacts the repeats of the selected row.

Figure 3:
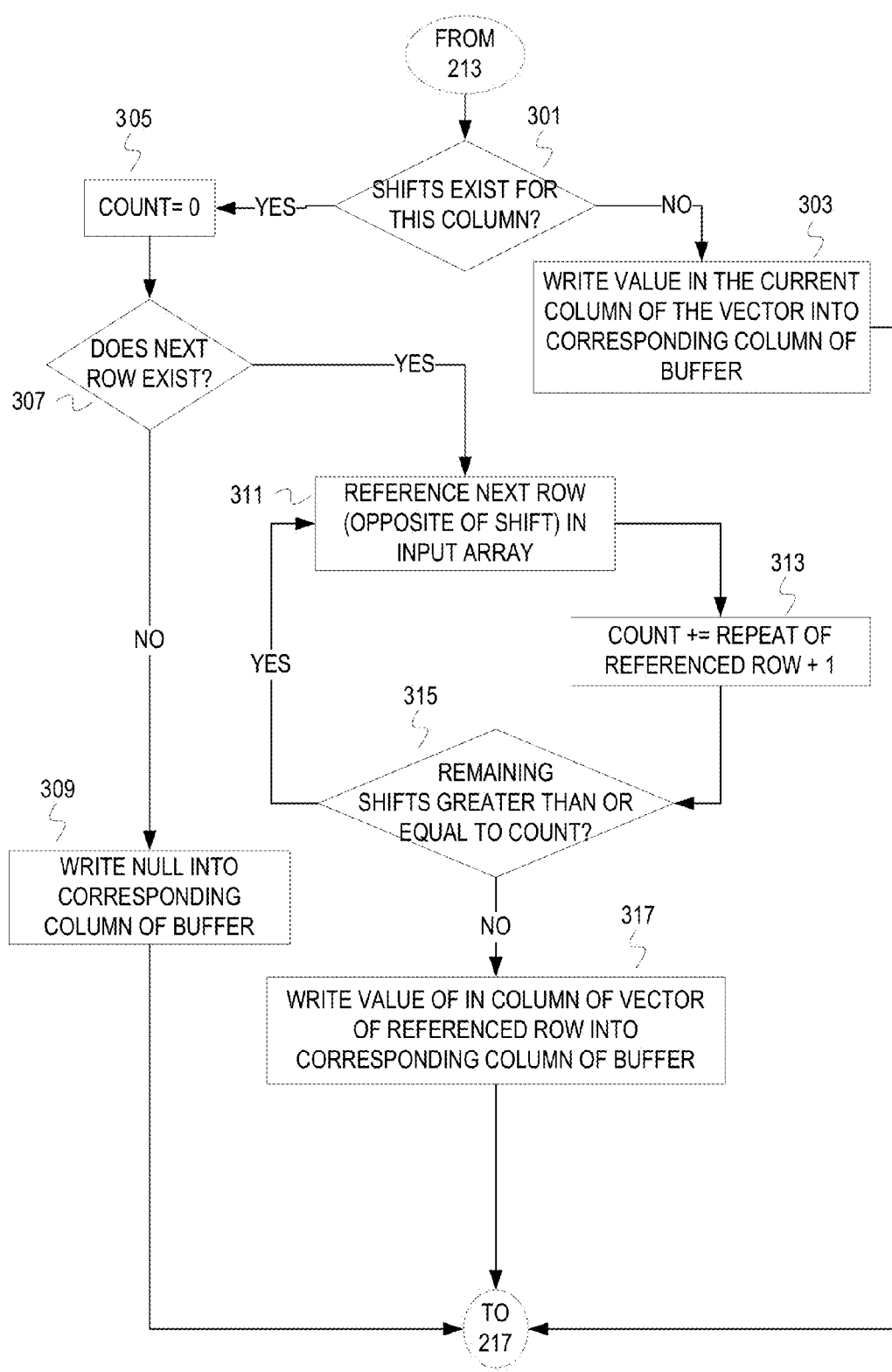
FIG. 3 provides example detailed operations for block 215.

At block 213, a loop begins for each column in the vector of the selected input array row. The loop traverses each column/element of a vector to implement shifting for those elements of a vector that are shifted. The loop repeats block 215 for each column or vector element. At block 215, each column of the vector is shifted in accordance with the shifts and repeats for the vector to create a new vector. The re-aligning shifts in nulls (or another value that represents no data) when shifts go outside of the input array. FIG. 3 provides example detailed operations for block 215.

At block 301, it is determined if there are any remaining shifts for the current column. The remaining shifts can be represented as the difference between the shift counter and the number of shifts indicated for the current column. Columns or vector elements that are not shifted have 0 remaining shifts. If there are no shifts for the column, control flows to block 303. If there are shifts for the column, then control flows to block 305.

At block 303, the value in the vector at the current column is written into the buffer at the corresponding column. Control flows from block 303 to block 217 of FIG. 2.

If there are any shifts determined at block 301, then a count is initialized at block 305. The count is used to count rows and repeats traversed while shifting since a shift can lead to shifting a value beyond an adjacent vector with repeats.

At block 307, it is determined if a next row exists. In the case of shifting up, the next row is the next row below the currently selected/referenced row. In the case of shifting down, the next row is the next row above the currently selected/referenced row. If referencing up or down for shifting goes beyond the bounds of the input array, then control flows to block 309. If the next row exists, control flows to block 311.

If the next row was determined not to exist at block 307, then a null/no data value is written into the corresponding column of the buffer at block 309. Control flows from block 309 to block 319.

If the next row was determined to exist at block 307, then the next row (opposite of the shifting direction) of the input array is referenced (in contrast to "selected") 311. The "referenced" row is distinguished from the "selected" row because the "referenced" row is not the row being processed. The "referenced" row is either being traversed or is a source for a shifted value.

At block 313, count is incremented by the number of repeats of the referenced row plus 1. The additional "plus 1" accommodate the first instance of the vector.

At block 315, it is determined if the remaining shifts is greater than or equal to count. In other words, it is determined if the shifting goes beyond the referenced row including repeats. If it does, then control flows back to block 311 to continue traversing up or down the input array. Otherwise, control flows to block 317.

At block 317, the value at the column of the vector of the referenced row is written into the corresponding column of the buffer.

Returning to FIG. 2, the loop termination block 217 determines whether the entire vector has been traversed. If the entire vector has been traversed, then control flows to block 219. Otherwise, control returns to block 213 to move to the next column.

Figure 4:
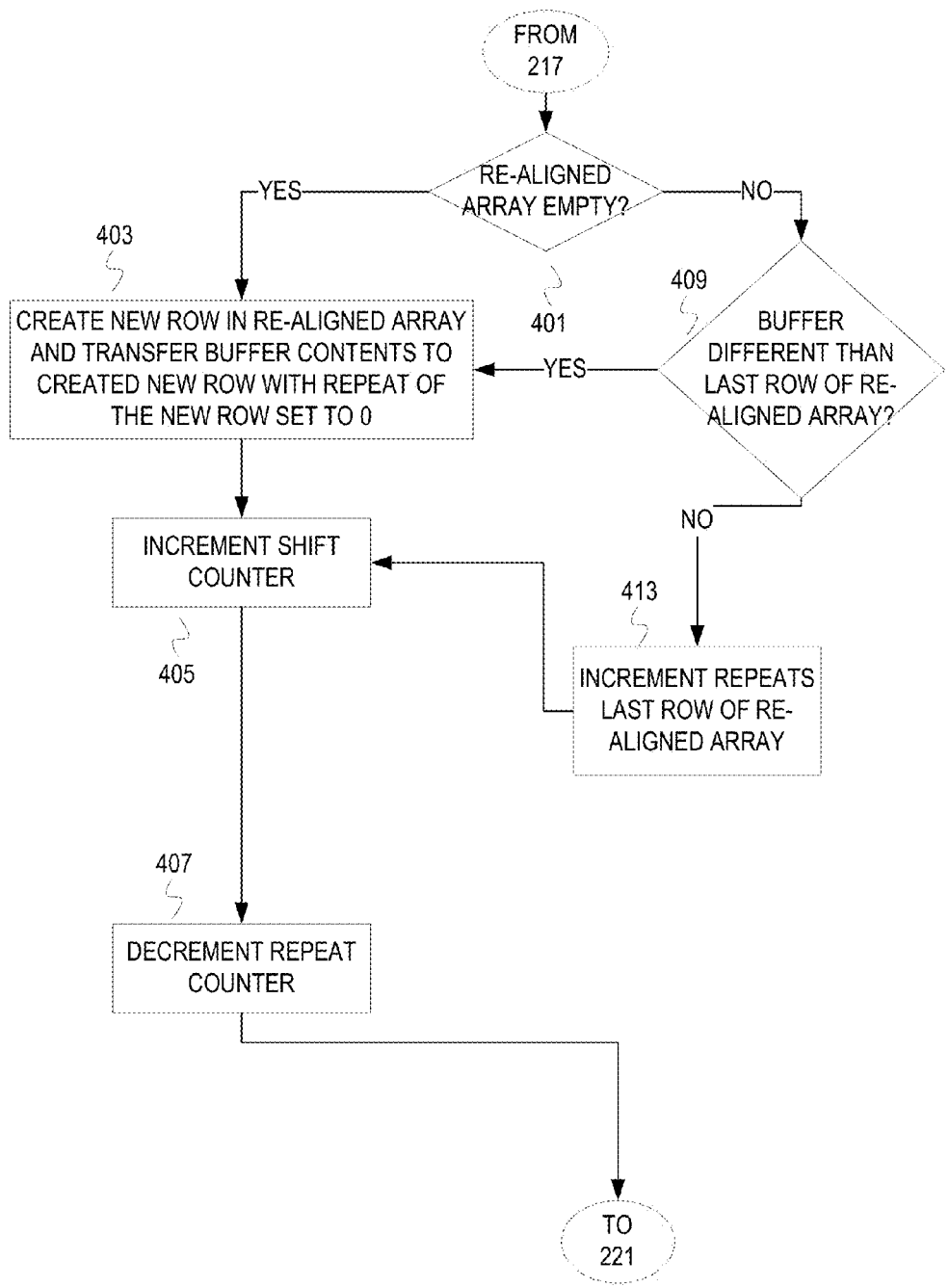
FIG. 4 depicts example detail operations for block 219.

At block 219, the re-aligned array is updated based on buffer content and counters. The re-aligned array will either be updated to add a new row or increase repeats of a last row. "Last row" refers to the most recently added row of the re-aligned array. The last row may also be referred to as the first row depending on organization of the input array. re-aligned array, and shifting. FIG. 4 depicts example detail operations for block 219.

At block 401, it is determine if the re-aligned array is empty or if no rows have been created yet for the re-aligned array. If the re-aligned array is empty, then control flows to block 403. Otherwise, control flows to block 409.

At block 409, it is determined if the buffer contents ("buffer vector") is different than the vector of the last row of the re-aligned array. If there is a difference, then control flows to block 403. If the buffer vector is the same as the vector of the re-aligned array's last row, then control flows to block 413.

At block 413, the repeats counter of the last row of the re-aligned array is incremented. Control flows from block 413 to block 405.

If the re-aligned array was empty or the buffer vector was determined to be different than the vector of the last row of the re-aligned array, then control flowed to block 403. At block 403, a new row is created for the re-aligned array. Embodiments can use any of a number of techniques for building up a data structure. For example, a linked list of references can be built up and connected to each additional instantiated row. The buffer vector is written into the new row and the repeat for the new row is set to 0.

At block 405, the shift counter is incremented. The change to the shift counter represents a reduction in the remaining shifts for the vector of the selected row.

At block 407, the repeats counter is decremented. Decrementing the repeat counter is one technique for tracking reduction in the number of repeats of the vector of the selected input array row resulting from shifting. Control flows from block 407 to block 221.

Returning to FIG. 2, it is determined whether the shift counter exceeds the maximum shifts or if the repeats counter has been exhausted at block 221. The shifts counter exceeds maximum shifts when shifting has completed for the selected row of the input array. In the illustrated technique, the repeats counter is exhausted when decremented to −1, since 0 indicates 1 instance of a vector. Exhaustion of the repeats counter represents exhaustion of the vector of the selected row. Either condition indicates that selection should move on to the next row in the input array. If either condition evaluates to true, then control flows to block 501 of FIG. 5. If both conditions do not exist, then control flows back to block 213 to iterate through the columns of the vector of the selected input array row again.

Figure 5:
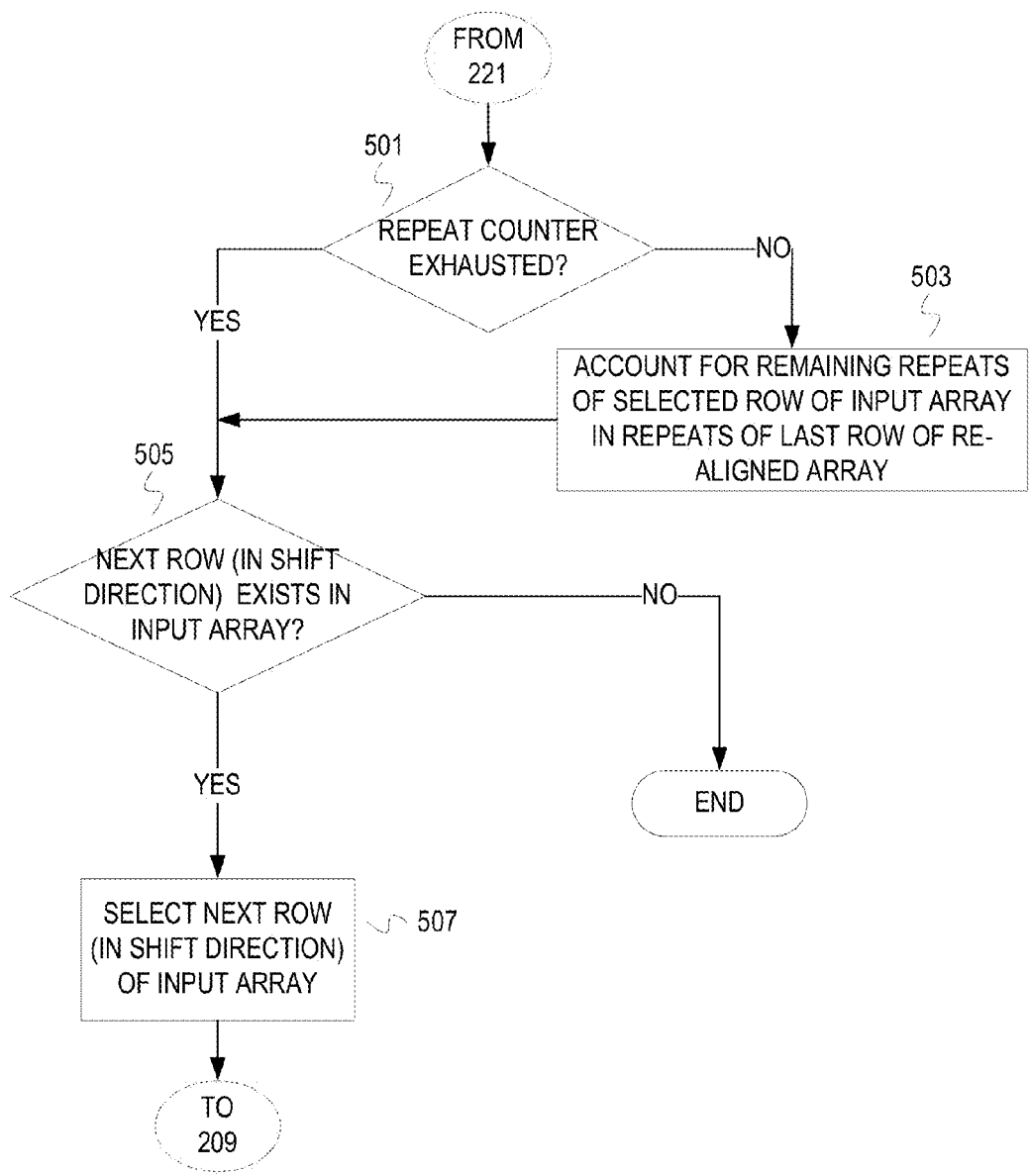
FIG. 5 continues from the operations of FIG. 2.

FIG. 5 continues from the operations of FIG. 2. At block 501, it is determined which of the conditions evaluated in block 221 exist. In this example, it is determined whether the repeat counter has been exhausted at block 501. If the repeat counter has been exhausted, then control flows to block 505. If not, then control flows to block 503 because there are still shifts to be done but the vector of the currently selected row has not been exhausted (i.e., the remaining sequential instance of this vector can be incorporated into re-aligned array as still compressed).

At block 503, the remaining repeats of the vector of the selected input array row are accounted for in the repeats of the last row of the re-aligned array. In this example illustration, the repeats counter plus 1 is added to the repeats of the last row of the re-aligned row. Thus, the remaining instances of the vector are represented as compressed without additional accesses of the selected input array row.

At block 505, it is determined if the next row (in the shift direction) exists in the input array. In other words, it is determined if there is an additional row of the input array to process. If there is an additional row, then control flows to block 507, where the next row (in the shift direction) of the input array is selected. Control flows from block 507 back to block 209 to iterate through columns of the newly selected input array row. Otherwise, the compressed data array has been processed and the re-aligning process ends.

The example operations depicted in FIG. 2 are provided to aid in understanding the inventive subject matter and are not to be used to limit embodiments of the inventive subject matter. For example, FIGS. 2-5 may perform additional operations to secure space for the re-aligned array in advance or to explicitly clear the buffer in addition to writing over the buffer contents.

Merging Compressed Data Arrays

In addition to re-aligning a compressed data array, situations arise for merging compressed data arrays. As mentioned earlier, trace data of processors are captured in data arrays. A chip may have multiple trace data arrays to capture trace data from different sources. For a coherent view of the trace data and analysis, the data from the multiple trace data arrays are merged together after being read out. Differing sizes between the data arrays and an offset (e.g., for delayed data) are different factors that can impact the merging. Compressed data arrays to be merged have a defined converging point that correlates to one of the dimensions of the data arrays. Vectors are merged based on the corresponding compression information to generate a merged version of the compressed data arrays. When the data arrays are of different sizes, the larger is concatenated with null/no data values until reaching a point of overlap with the smaller array. When accommodating offset, null/no data values are employed to account for the offset. Merging data arrays while preserving compression allows for efficient merging of the data arrays. Instead of expending hours decompressing and then merging lines of data that can go into the millions, compact compressed data sets can be merged in substantially less time. Again, the reference to trace data is employed merely as a helpful illustration. Embodiments for merging compressed data arrays can be applied in other scenarios that utilized compressed data arrays.

Figure 6:
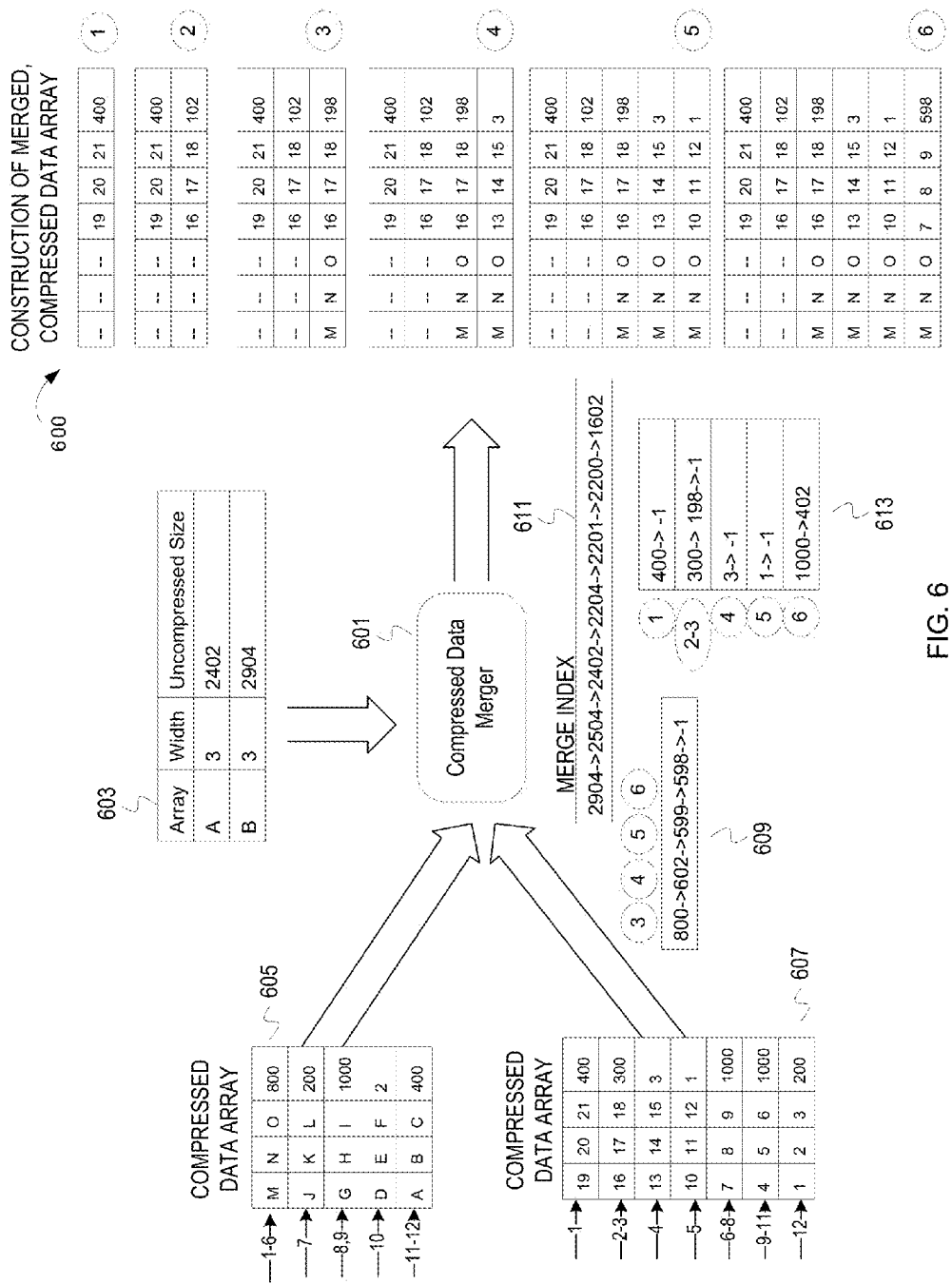
Figure 7:
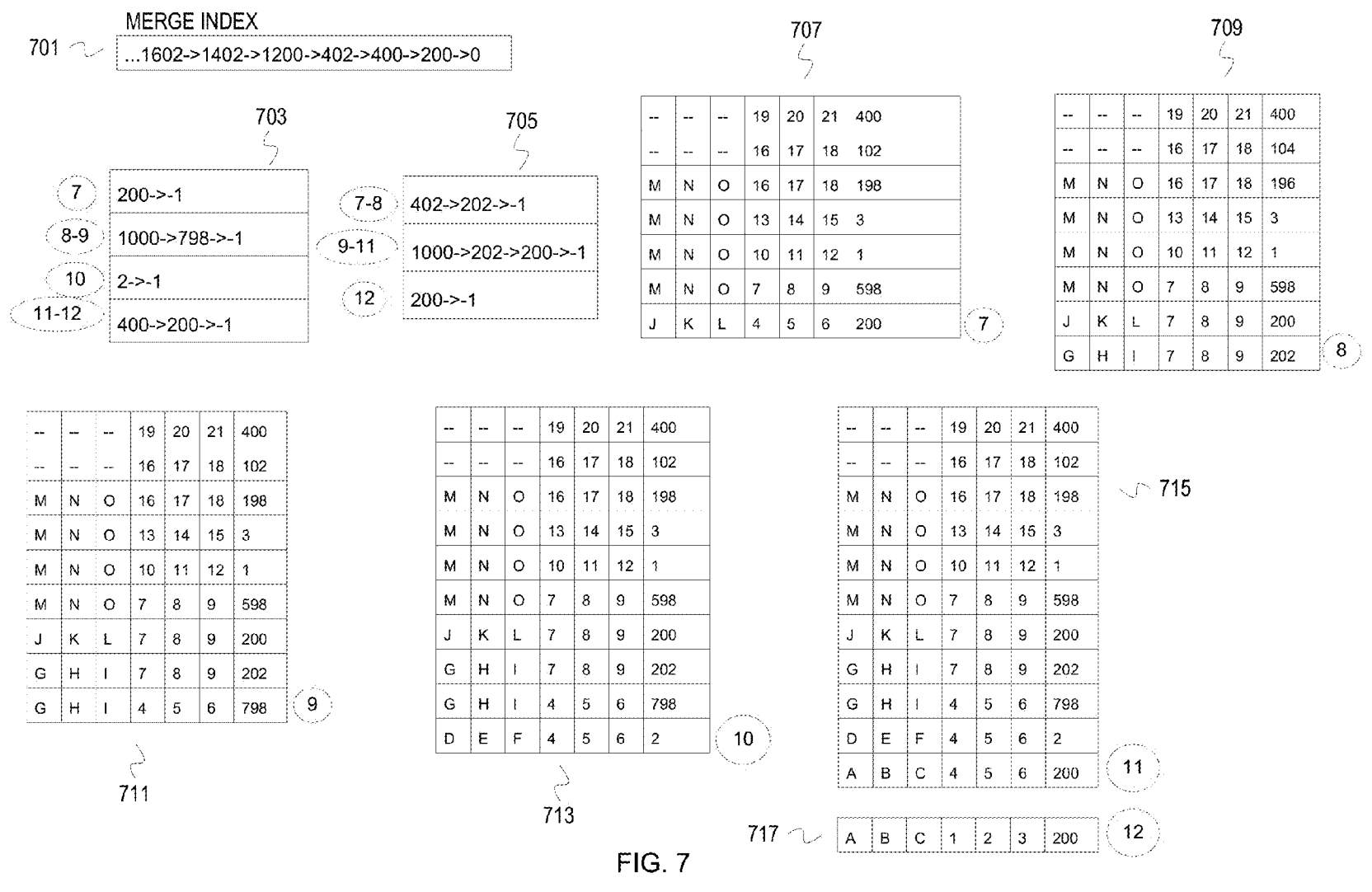

FIGS. 6 and 7 depict a conceptual diagram of an example merger of compressed data arrays of different sizes while preserving compression. FIG. 6 depicts a compressed data array A 605 and a compressed data array B 607. Both arrays have vector widths of 3, and an additional entry for the compression information, which may or may not be implemented as part of the data arrays. Instead of repeats as with the shifting, the compression information in FIGS. 6 and 7 indicate instances. In other words, a vector that occurs a single time has a compression data of '1' instead of '0' as in the re-alignment illustrations. The compressed data array 605 has 5 vectors and an uncompressed size of 2402. The compressed data array 607 has 7 vectors and an uncompressed size of 2904. FIG. 6 depicts the uncompressed size of the data arrays and vector widths being input (data array specifications 603) into a compressed data merger 601. The compressed data merger 601 is responsible for stitching together the compressed data arrays to create a merged and compressed data array. Although FIG. 6 depicts the compressed data merger 601 as receiving the data array specifications 603, the compressed data merger 601 can quickly scan the compression information for the compressed data arrays to determine the size information.

FIG. 6 uses different notations to depict iterations in construction of a merged, compressed data array. The sequence of construction incarnations of the merged data array is identified with label 600, but only the first 6 iterations could be depicted in FIG. 6. Each individual construction iteration is identified by a number in an oval adjacent to corresponding instance of the merged data array. The iterations of construction continue to be depicted on FIG. 7. But in FIG. 7, each construction iteration is individually labeled. The compressed data arrays 605, 605 are also depicted with indications of iterations. Arrows depicting indexing into the compressed data arrays 605, 607 are depicted to indicate which vectors are being indexed in a particular iteration. Changes in a merge index 611 are depicted with corresponding iterations in circles, and changes in compression information for the compressed data arrays are indicated with iterations in circles.

Using the size information for the compressed data arrays 605, 607, the compressed data merger 601 identified the larger of the arrays, which is array B (607). The compressed data merger 601 begins constructing each vector of the merged array with vectors of the larger array appended to a vector of null values in iterations 1 and 2. The vectors of the array 605 are appended to vectors of null values based on an assumption that array 607 should be the leftmost values in the merged array. In the second iteration, the compressed data merger 601 determines that the compressed data arrays 605 607 begin to overlap within the 300 instances of the second vector (second from top) of data array 607. Therefore, the compressed data merger 601 creates a vector for the merged array that appends the second vector of array 607 with null values with compression information that indicates 102 instances. In the third iteration, the compressed data merger 601 concatenates the first vector of the data array 605 with the second vector of the data array 607 since the second vector of the data array 607 has 198 remaining instances as indicated in the changing compression information 613 of data array 607.

Once the overlap point is reached between the data arrays, the compressed data merger 601 merges selected vectors up to the smaller of the instances as represented in the compression information. The first vector {M,N,O} of data array 605 has 800 instances. From iteration 3-6, the vector {M,N,O} is merged with a different vector of the data array 607 because the vectors have fewer instances. The instances of the vector {M,N,O} do not get exhausted until iteration 6 where the compressed data merger 601 creates a $6^{th}$ vector {M,N,O,7,8,9} in the merged array that has 598 instances. The compression information 609 for the vector {M,N,O} illustrates the allocations of instances of the vector {M,N,O} to merged vectors from iterations 3-6. Even though the vector {M,N,O} is not compressed into a single vector, the vector is still compressed into 4 occurrences in the merged array, which is substantially less than 800 occurrences. In addition the compression information for individual vectors being reduced, the merge index 611 reduces at iteration by the number of instances allocated to the merged array. After the $6^{th}$ vector is added to the merged array, the merge index, which represents remaining instances to account for in the merged array, has been reduced to 1602 from 2904.

FIG. 7 depicts the continuing changes in merged index 701, compression information 703 for vectors of the data array 605, and compression information 705 for the data array 607. Iterations 7-11 of the merged array are depicted as merged arrays 707, 709, 711, and 713. Due to space restrictions, the last iteration 12 is depicted with only the last added row 717. The iteration 715 and the last row 717 together show the resulting merged array. The final merged array has 12 vectors, which is a substantially less than 2904. Since the compressed data merger 601 operated upon compressed data arrays, the merged data array was created in 12 iterations. The efficiency can be more appreciated when processing more realistic sizes of data that goes into the millions of lines.

Figure 8:
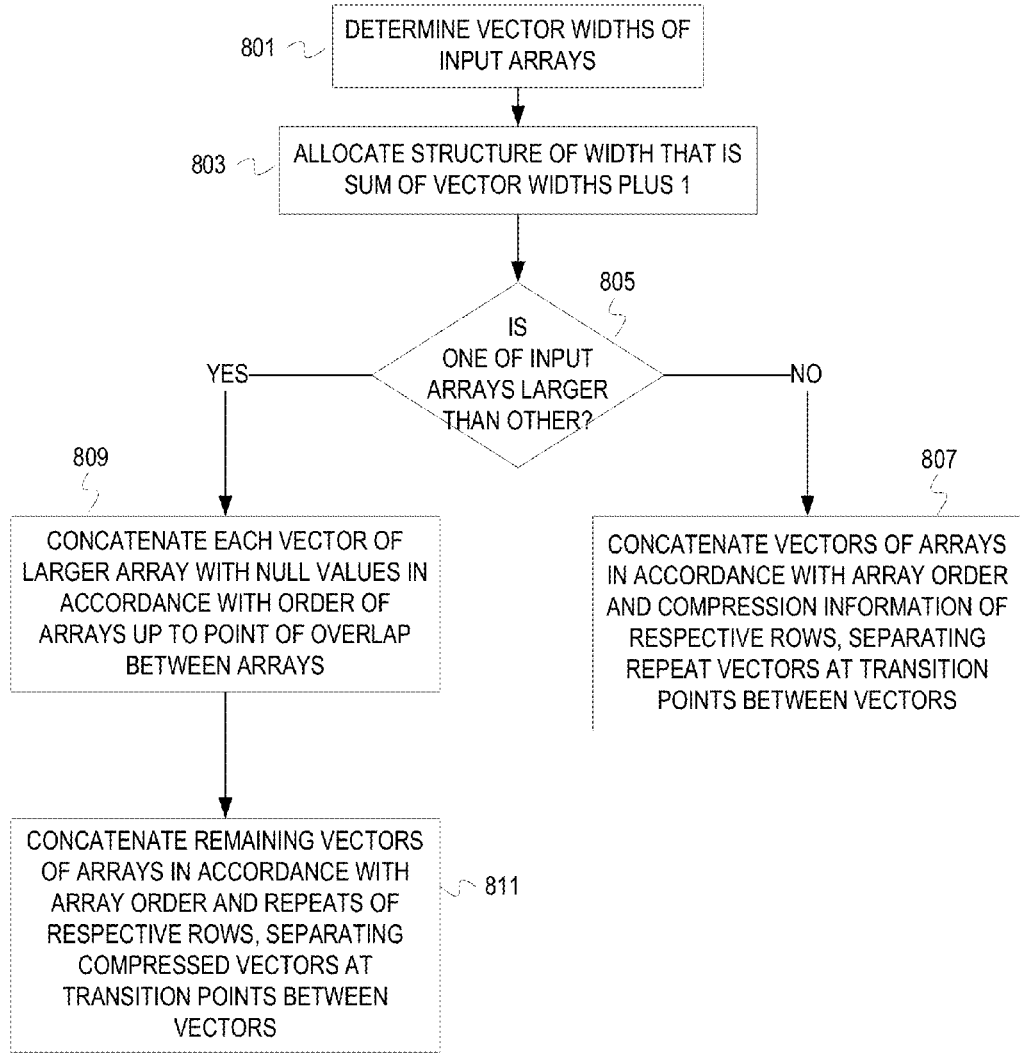
FIG. 8 depicts an example flowchart of example operations for merger of compressed data arrays.

FIG. 8 depicts an example flowchart of example operations for merger of compressed data arrays. At block 801, the vector lengths (or widths) of input arrays are determined.

At block 803, a structure having a width that is a sum of the vector widths plus 1. The additional width is to accommodate compression information, although implementations can maintain the compression information separately from the merged data array.

At block 805, it is determined whether one of the input arrays is larger. If one of the input arrays is larger, then control flows to block 809. If the input arrays are of the same size (e.g., have some number of total instances or cover same span of time), then control flows to block 807.

At block 807, the vectors of the input arrays are concatenated in accordance with array order and compression information of respective rows. Repeat vectors are separated at transition points between arrays. As illustrated in FIGS. 6 and 7, the compression information is used to transfer vectors as compressed up to points where the merging vector transitions to another vector because the instances have been exhausted according to the compression information.

If the input arrays are of different sizes, then control flows to block 809. At block 809, each vector of the larger input array is concatenated with a null values in accordance with array order up to the point of overlap between the arrays.

At block 811, the remaining vectors of the input arrays are concatenated in accordance with array order and compression information of respective rows. Repeat vectors are separated at transition points between vectors.

Figure 9:
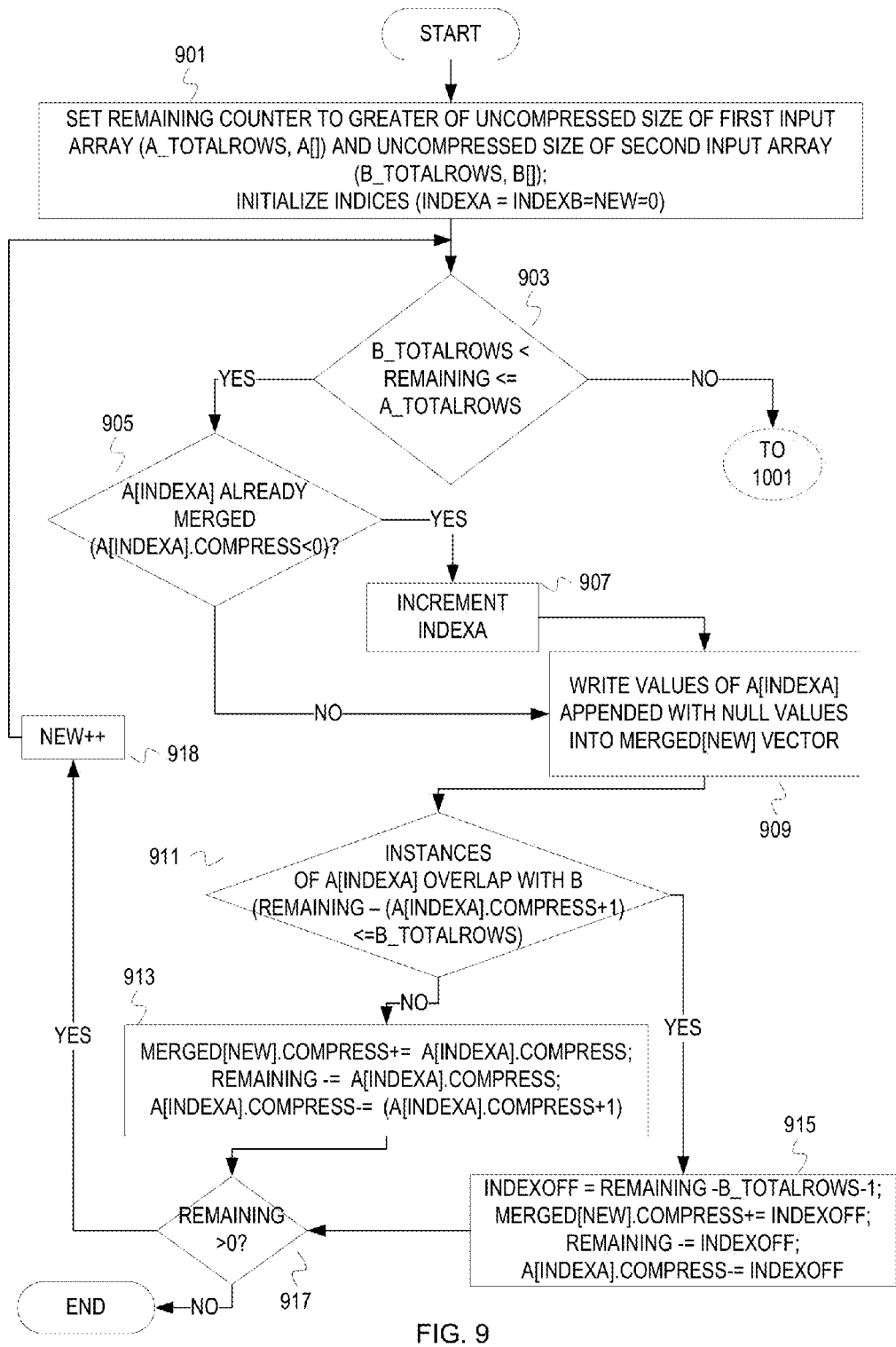
FIGS. 9-11 depict a flowchart of example operations for merging compressed data arrays using various counters and flags.
Figure 10:
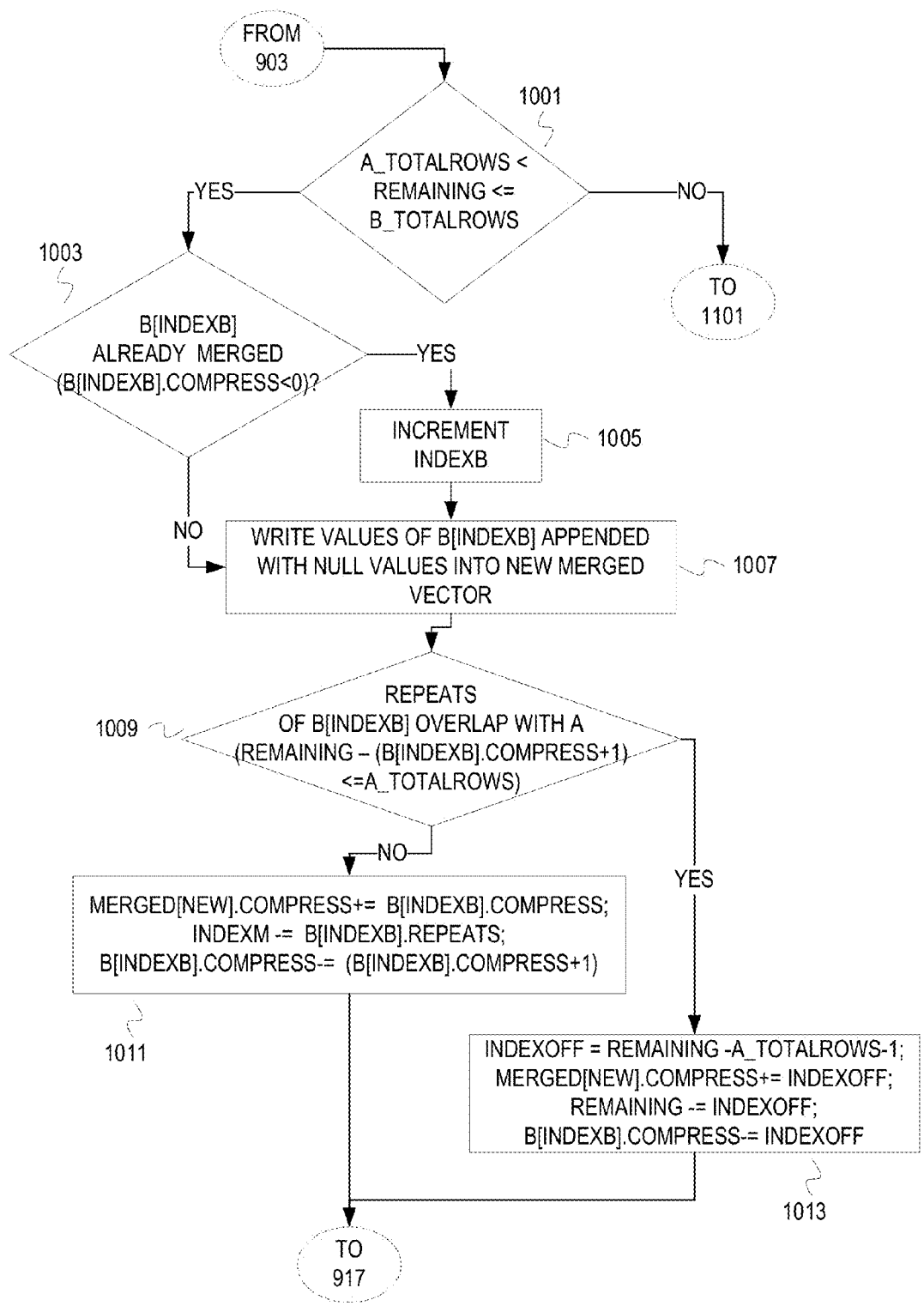
Figure 11:
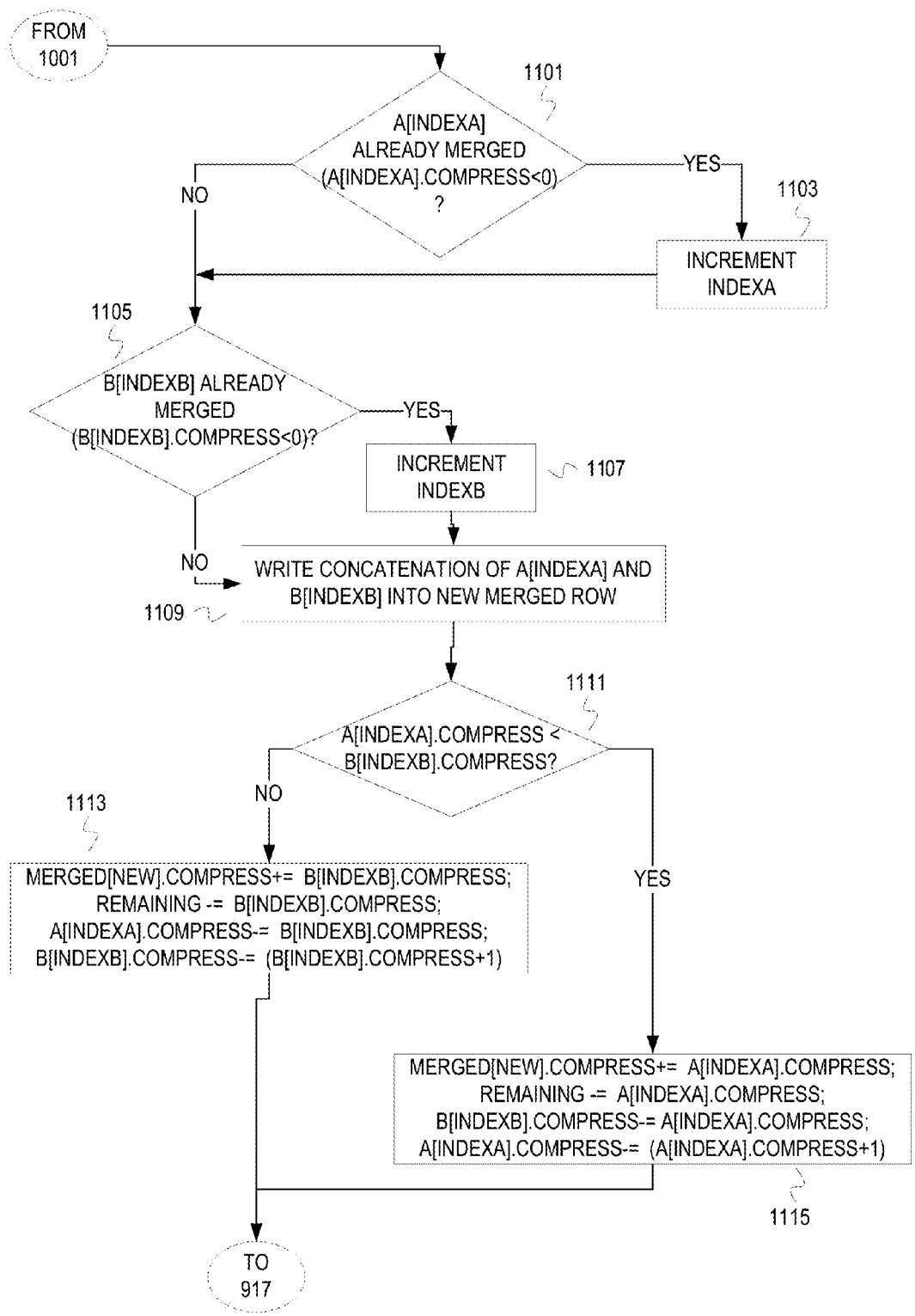

FIGS. 9-11 depict a flowchart of example operations for merging compressed data arrays using various counters and flags. At block 901, a remaining counter is set to a greater of the uncompressed size of a first input array A(A_TotalRows) and an uncompressed size of a second input array B (B_TotalRows). Indices into the arrays are initialized to zero (indexA=indexB=new=0).

At block 903, it is determined whether the input arrays have begun to overlap when A is the larger array (B_TotalRows<remaining<=A_TotalRows). If overlap has begun or array A is not the larger array, then control flows to block 1001 of FIG. 10 (i.e., B_TotalRows<remaining<=A_TotalRows evaluates to false). Otherwise, control flows to block 905.

At block 905, it is determined whether the instances of the vector indexed by indexA have been accounted for in the merged array (A[indexA]·compress<0). All instances of the indexed vector have been accounted for if the compress information has been reduced to less than 0. If the vector has been accounted for, then control flows to block 907. If not, then control flows to block 909.

At block 907, indexA is incremented.

At block 909, null values appended to values of the vector indexed by indexA are written into a new vector created for the merged array.

At block 911, it is determined whether the remaining instances of the vector indexed by indexA overlap with array B (remaining−(A[indexA]·compress+1)<=B_TotalRows). If overlap occurs, then control flows to block 915. If it does not, then control flows to block 913.

At block 913, the compression information of the new vector of the merged array is increased by the compression information of the indexed row of the array A. The remaining counter is decremented by the compression information of the indexed row of the array A. And the compression information of the indexed row of array A is reduced by itself plus 1, which marks the vector as exhausted. Control flows from block 913 to block 917.

At block 915, an indexoff parameter is set to (remaining−B_TotalRows−1). The indexoff represents the remaining gap between arrays when a vector overlap begins. The compression information of the new vector of the merged array is increased by indexoff, the remaining counter is decremented by the indexoff. And the compression information for the indexed vector of array A is reduced by indexoff. These adjustments are made to separate a compressed vector of an input array into different vectors of the merged array. With reference to FIG. 6, the indexoff would account for the 102 instances of vector {16, 17, 18} that are inserted into the merged array and separated from the 198 instances of that vector to be merged with the vector {M,N,O} in the third iteration. Control flows from block 915 to block 917.

At block 917, it is determined whether there are any remaining vectors to merge (remaining>0). If not, then the merging process ends. If there are additional vectors to merge, then control flows to block 918.

At block 918, the index into the merged array is incremented (new++). Embodiments do not necessarily maintain an index into the merged array. The merged array may be a collection of individual vectors that are created or instantiated in each iteration and that are later assembled (or incrementally assembled each iteration) into a coherent structure. Control flows from block 918 to block 903.

FIG. 10 depicts the operations that continue from block 903 of FIG. 9. Many of the operations in FIG. 10 are similar to the operations of FIG. 9. But the operations in FIG. 10 are triggered when the second compressed data array B is the larger array. Note that larger refers to the information spanned not necessarily the number of vectors. Array B may only have 2 vectors, but those 2 vectors may account for 2 million lines of data.

At block 1001, it is determined whether the input arrays have begun to overlap when array B is the larger array (A_TotalRows<remaining<=B_TotalRows). If overlap has begun, then control flows to block 1101 of FIG. 11 (i.e., A_TotalRows<remaining<=B_TotalRows evaluates to false). If B is the larger array and the arrays do not yet overlap, then control flows to block 1003.

At block 1003, it is determined whether the instances of the vector indexed by indexB have been accounted for in the merged array (B[indexB]·compress<0). All instances of the indexed vector have been accounted for if the compress information has been reduced to less than 0 in this illustrated implementation. If the vector has been accounted for, then control flows to block 1005. If not, then control flows to block 1007.

At block 1005, indexB is incremented.

At block 1007, values of the vector indexed by indexB appended to null values are written into a new vector created for the merged array.

At block 1009, it is determined whether the remaining instances of the vector indexed by indexB overlap with array A (remaining−(B[indexB]·compress+1)<=A_TotalRows). If overlap occurs, then control flows to block 1013. If it does not, then control flows to block 1011.

At block 1011, the compression information of the new vector of the merged array is increased by the compression information of the indexed row of the array B. The remaining counter is decremented by the compression information of the indexed row of the array B. And the compression information of the indexed row of array B is reduced by itself plus 1, which marks the vector as exhausted. Control flows from block 1011 to block 917.

At block 1013, the indexoff parameter is set to (remaining−A_TotalRows−1). The indexoff represents the remaining gap between arrays when a vector overlap begins. The compression information of the new vector of the merged array is increased by indexoff, the remaining counter is decremented by the indexoff. And the compression information for the indexed vector of array B is reduced by indexoff. These adjustments are made to separate a compressed vector of an input array into different vectors of the merged array. Control flows from block 1013 to block 917.

FIG. 11 depicts the operations that continue from block 1001 of FIG. 10. Many of the operations in FIG. 11 are similar to the operations of FIGS. 9 and 10. But the operations in FIG. 10 are triggered when the compressed data arrays overlap and are being merged together instead of with null values.

Blocks 1101 and 1105 determine whether currently indexed vectors of the input arrays have been exhausted. In other words, the merger code determines whether to index to a new vector for merging. At block 1101, it is determined whether the instances of the vector indexed by indexA have been accounted for in the merged array (A[indexA]·compress<0). All instances of the indexed vector have been accounted for if the compress information has been reduced to less than 0 in this example illustration. If the vector has been accounted for, then control flows to block 1103. If not, then control flows to block 1105. At block 1105, it is determined whether the instances of the vector indexed by indexB have been accounted for in the merged array (B[indexB]·compress<0). All instances of the indexed vector have been accounted for if the compress information has been reduced to less than 0 in this illustrated implementation. If the remaining instances of the vector have been accounted for, then control flows to block 1107. If not, then control flows to block 1109.

Blocks 1103 and 1107 advance the pointers or indexes to a next vector of respective input arrays for merging since the currently indexed vector has already been incorporated into the merged array. At block 1103, indexA is incremented. Control flows from block 1103 to block 1105. At block 1107, indexB is incremented. Control flows from block 1107 to block 1109.

At block 1109, a concatenation of the values in the vector indexed by A[indexA] and the values in the vector indexed by B[indexB] is written into a new vector created for the merged array.

At block 1111, it is determined which of the indexed vectors has fewer remaining instances. The indexed vector with fewer remaining instances will be fully incorporated into the merged array (i.e., exhausted). In this example illustration, the determination is made with evaluating A[indexA]·compress<B[indexB]·compress. If the remaining instance of the vector indexed in array A has fewer remaining instances, then control flows to block 1115. If the remaining instances of the vector indexed in array B has fewer remaining instances (or if the remaining instances between indexed vectors is equal), then control flows to block 1113. If the remaining instances are equal between vectors, either of blocks 1113 and 1115 will reduce the instances for both vectors to less than 0 to indicates complete incorporation of the vectors into the merged array.

At block 1113, the compression information of the new vector of the merged array is increased by the compression information of the indexed row of the array B. The remaining counter is decremented by the compression information of the indexed row of the array B. The compression information of the row indexed by indexA in array A is reduced by the compression information of the row indexed by indexB in array B. This effectively extracts some of the instances of the array A and updates the compression information to indicate remaining instances. The compression information of the indexed row of array B is reduced by itself plus 1, which marks the vector as exhausted. Control flows from block 1113 to block 917.

At block 1115, the compression information of the new vector of the merged array is increased by the compression information of the indexed row of the array A. The remaining counter is decremented by the compression information of the indexed row of the array A. The compression information of the row indexed by indexB in array B is reduced by the compression information of the row indexed by indexA in array A. This effectively extracts some of the instances of the array B and updates the compression information to indicate remaining instances. The compression information of the indexed row of array A is reduced by itself plus 1, which marks the vector as exhausted. Control flows from block 1115 to block 917.

Figure 12:
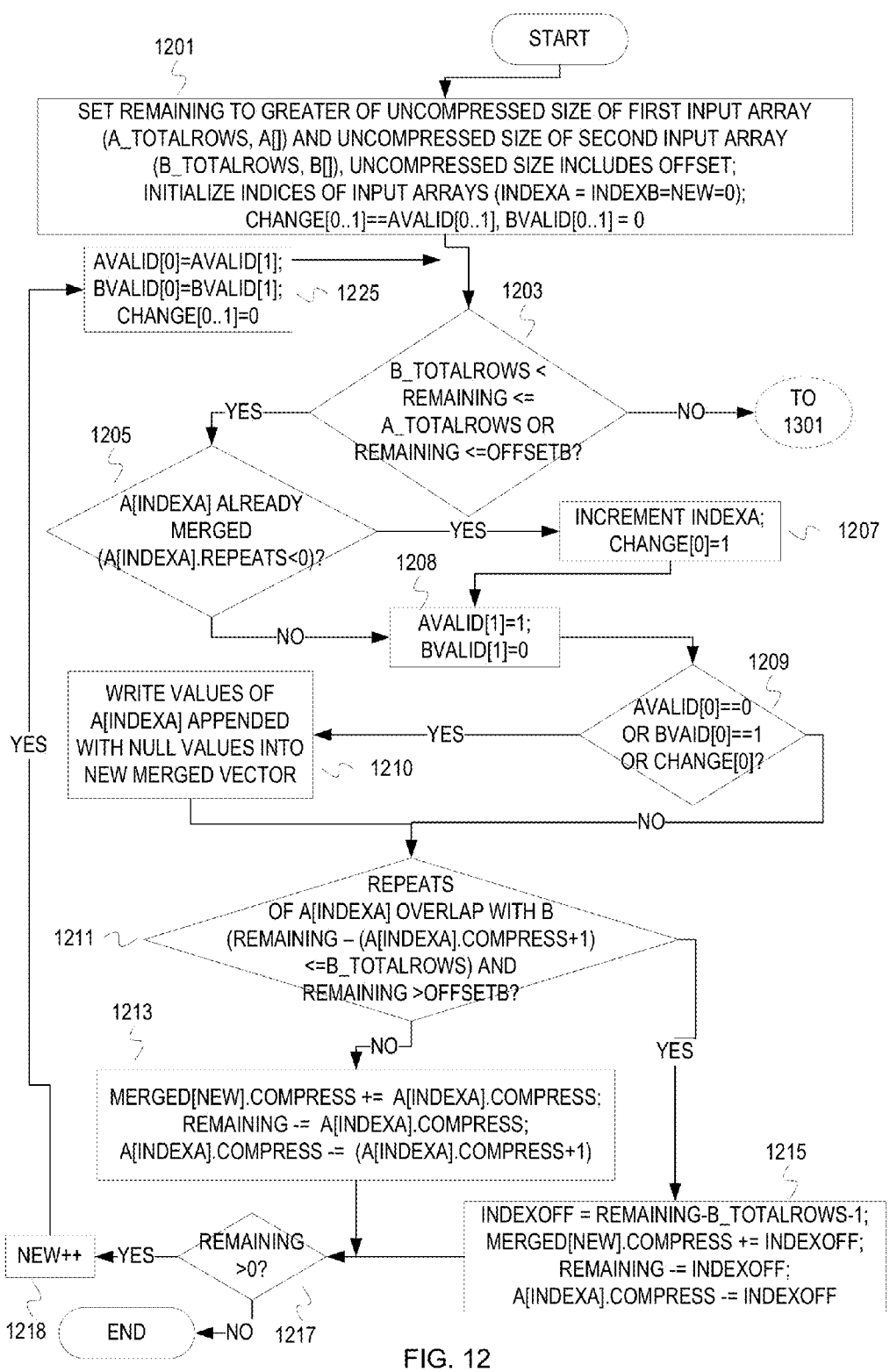
FIGS. 12-14 depict a flowchart of example operations that applies an offset to the affected compressed input array while merging the compressed input arrays.
Figure 13:
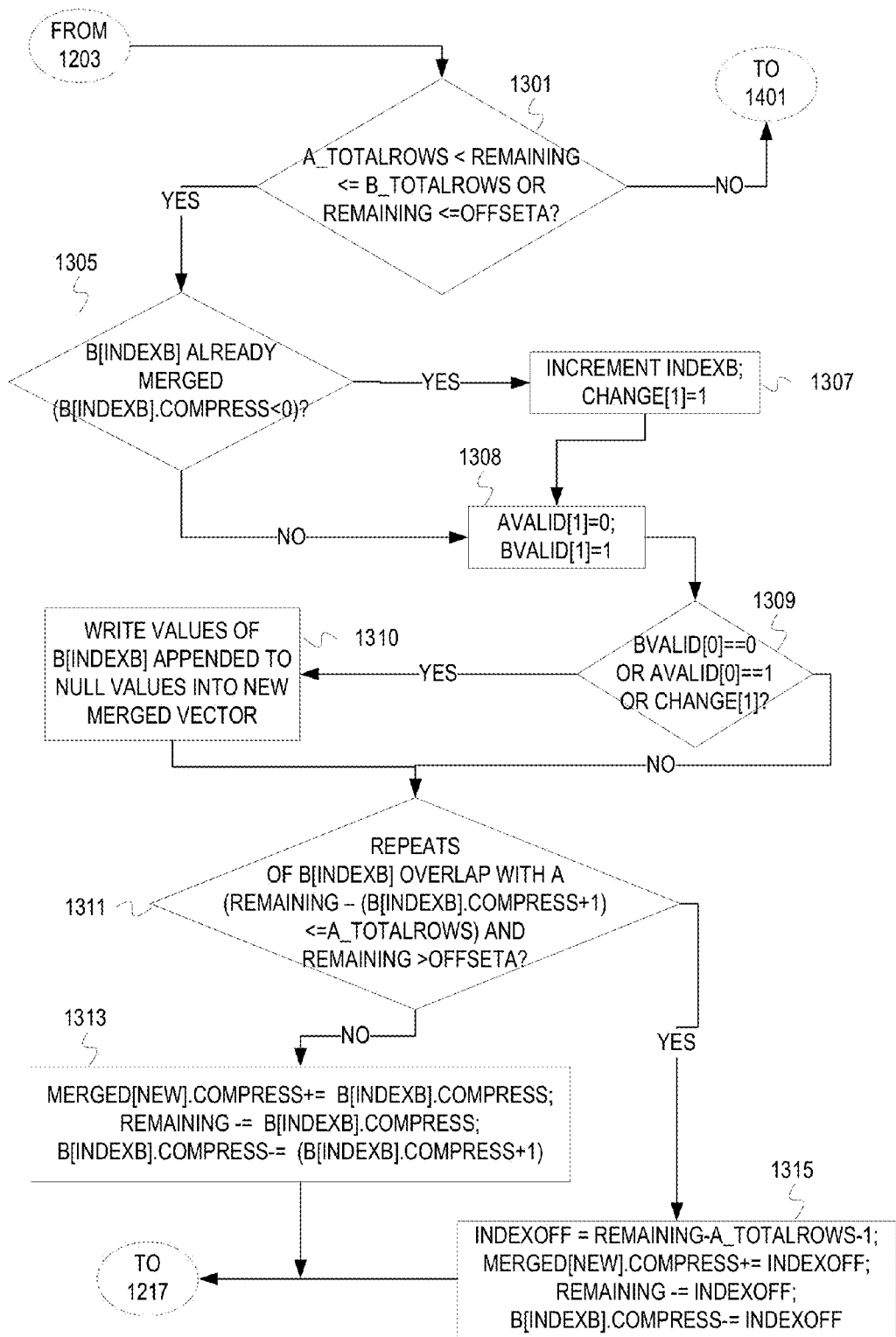
Figure 14:
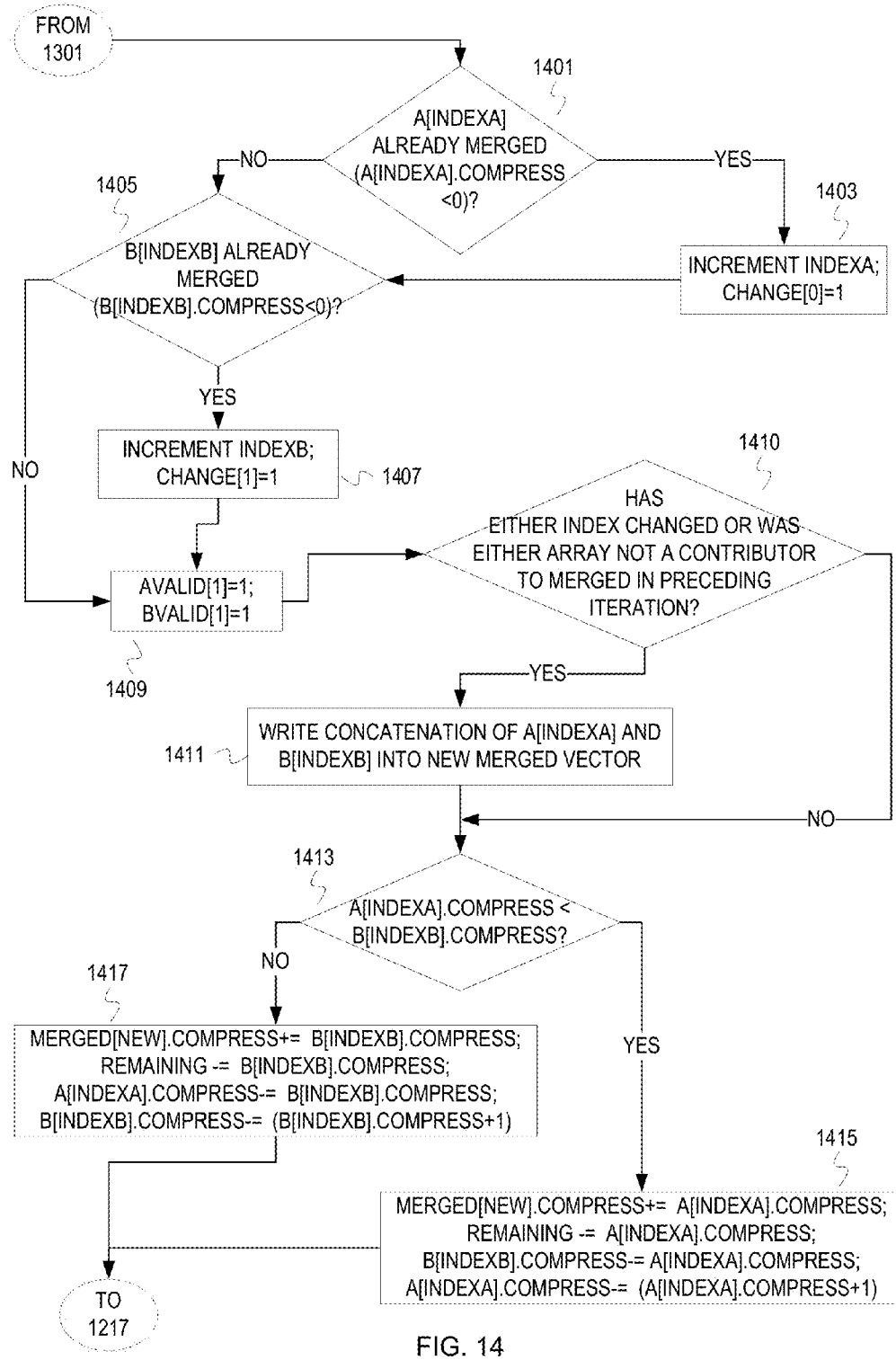

As mentioned earlier, an offset may be applied to one of the input arrays to be merged. FIGS. 12-14 depict a flowchart of example operations that applies an offset to the affected compressed input array while merging the compressed input arrays. Many of the example operations of FIGS. 12-14 are similar to the operations in FIGS. 9-11, but FIGS. 12-14 start to incorporate null values when the offset impacts the merging of vectors. FIGS. 12-14 employ additional parameters to account for the offset and recognize when the offset, compressed input array has been completely incorporated into the merged array.

At block 1201, a remaining counter is set to a greater of the uncompressed size of a first input array A (A_TotalRows) and an uncompressed size of a second input array B (B_TotalRows). The uncompressed size of an array to be offset includes the size of the offset. The size of the offset is referred to in FIGS. 12-14 as OffsetA and OffsetB. One or both of the arrays may be offset. Indices into the arrays are initialized to zero (indexA=indexB=new=0). Two element arrays change[0 . . . 1], Avalid[0 . . . 1], Bvalid[0 . . . 1] are initialized to 0. The parameter change marks when either of the indices into the input arrays has changed. For this example, change[0] corresponds to array A while change[1] corresponds to array B. The parameters Avalid and Bvalid track transition of a respective array between being a valid input into the merged array and invalid (i.e., not used) across two iterations. In this example illustration, a value of 0 represents invalid while 1 represents valid. Avalid[1] and Bvalid[1] correspond to current contributing state of the arrays, whereas Avalid[0] and Bvalid[0] corresponds to the previous state.

At block 1203, it is determined whether the input arrays have begun to overlap when A is the larger array or whether the merger now accounts for any offset in array B (B_TotalRows<remaining<=A_TotalRows OR remaining<=OffsetB). If the conditional evaluates to false, then control flows to block 1301 of FIG. 13. Otherwise, control flows to block 1205.

At block 1205, it is determined whether the instances of the vector indexed by indexA have been accounted for in the merged array (A[indexA]·compress<0). All instances of the indexed vector have been accounted for if the compress information has been reduced to less than 0. If the vector has been accounted for, then control flows to block 1207. If not, then control flows to block 1208.

At block 1207, indexA is incremented, and the change is recorded (change[0]=1).

At block 1208, array A is marked as a contributor to the merged array (Avalid[1]=1; Bvalid[1]=0).

At block 1209, it is determined whether either array's contributor state has changed from a last iteration or whether the indexed vector of array A has changed (Avalid[0]==0 OR Bvalid[0]==1 OR change[0]). If the condition evaluates to true, then control flows to block 1210. If the condition evaluates to false, then control flows to block 1211. A false condition indicates that at least one instance of the indexed vector of array A has already been incorporated into the merged array with null values and the compression information for the merged vector will be updated.

At block 1210, null values appended to values of the vector indexed by indexA are written into a new vector created for the merged array.

At block 1211, it is determined whether the remaining instances of the vector indexed by indexA overlap with array B and if the offset point has not yet been reached (remaining-(A[indexA]·compress+1)<=B_TotalRows AND remaining>OffsetB). If the point or boundary of overlap has been reached and the point or boundary of offset has not been reached, then control flows to block 1215. Otherwise, control flows to block 1213.

At block 1213, the compression information of the new vector of the merged array is increased by the compression information of the indexed row of the array A. The remaining counter is decremented by the compression information of the indexed row of the array A. And the compression information of the indexed row of array A is reduced by itself plus 1, which marks the vector as exhausted. Control flows from block 1213 to block 1217.

At block 1215, an indexoff parameter is set to (remaining–B_TotalRows–1). The indexoff represents the remaining gap between arrays when a vector overlap begins. The compression information of the new vector of the merged array is increased by indexoff, the remaining counter is decremented by the indexoff. And the compression information for the indexed vector of array A is reduced by indexoff. These adjustments are made to separate a compressed vector of an input array into different vectors of the merged array. Control flows from block 1215 to block 1217.

At block 1217, it is determined whether there are any remaining vectors to merge (remaining>0). If not, then the merging process ends. If there are additional vectors to merge, then control flows to block 1218.

At block 918, the index into the merged array is incremented (new++). Embodiments do not necessarily maintain an index into the merged array. The merged array may be a collection of individual vectors that are created or instantiated in each iteration and that are later assembled (or incrementally assembled each iteration) into a coherent structure. Control flows from block 1218 to block 1225.

At block 1225, the parameters are updated roll history of the contributor state of the arrays and reset the change markers (Avalid[0]=Avalid[1]; Bvalid[0]=Bvalid[1]; change[0 . . . 1]=0). Control returns to block 1203 from block 125.

FIG. 13 depicts the operations that continue from block 1203 of FIG. 12. Many of the operations in FIG. 13 are similar to the operations of FIG. 12. But the operations in FIG. 12 are triggered when the second compressed data array B is the larger array or the boundary where offset to array A affects the merger.

At block 1301, it is determined whether the input arrays have begun to overlap when array B is the larger array of the point at which offset to array A impacts merging has been reached (A_TotalRows<remaining<=B_TotalRows OR remaining<=OffsetA). If the conditional evaluates to false, then control flows to block 1401 of FIG. 14. Otherwise, control flows to block 1305.

At block 1305, it is determined whether the instances of the vector indexed by indexB have been accounted for in the merged array (B[indexB]·compress<0). All instances of the indexed vector have been accounted for if the compress information has been reduced to less than 0. If the vector has been accounted for, then control flows to block 1307. If not, then control flows to block 1308.

At block 1307, indexB is incremented, and the change is recorded (change[1]=1).

At block 1308, array B is marked as a contributor to the merged array and array A is marked as a non-contributor (Avalid[1]=0; Bvalid[1]=1).

At block 1309, it is determined whether either array's contributor state has changed from a last iteration or whether the indexed vector of array B has changed (Bvalid[0]==0 OR Avalid[0]==1 OR change[1]). If the condition evaluates to true, then control flows to block 1310. If the condition evaluates to false, then control flows to block 1311.

At block 1310, null values concatenated with the values of the vector indexed by indexB are written into a new vector created for the merged array.

At block 1311, it is determined whether the remaining instances of the vector indexed by indexB overlap with array A and if the offset point has not yet been reached (remaining–(B[indexB]·compress+1)<=A_TotalRows AND remaining>OffsetA). If the point or boundary of overlap has been reached and the point or boundary of offset has not been reached, then control flows to block 1315. Otherwise, control flows to block 1313.

At block 1313, the compression information of the new vector of the merged array is increased by the compression information of the indexed row of the array B. The remaining counter is decremented by the compression information of the indexed row of the array B. And the compression information of the indexed row of array B is reduced by itself plus 1, which marks the vector as exhausted. Control flows from block 1313 to block 1217.

At block 1315, an indexoff parameter is set to (remaining–A_TotalRows–1). The indexoff represents the remaining gap between arrays when a vector overlap begins. The compression information of the new vector of the merged array is increased by indexoff, the remaining counter is decremented by the indexoff. And the compression information for the indexed vector of array B is reduced by indexoff. These adjustments are made to separate a compressed vector of an input array into different vectors of the merged array. Control flows from block 1315 to block 1217.

FIG. 14 depicts the operations that continue from block 1301 of FIG. 13. Many of the operations in FIG. 14 are similar to the operations of FIGS. 12 and 13, and similar to the operations of FIG. 11. But the operations in FIG. 14 are triggered when the offset boundary has not been reached, and the compressed data arrays overlap and are being merged together instead of with null values.

Blocks 1401 and 1405 determine whether currently indexed vectors of the input arrays have been exhausted. In other words, the merger code determines whether to index to a new vector for merging. At block 1401, it is determined whether the instances of the vector indexed by indexA have been accounted for in the merged array (A[indexA]·compress<0). All instances of the indexed vector have been accounted for if the compress information has been reduced to less than 0 in this example illustration. If the vector has been accounted for, then control flows to block 1403. If not, then control flows to block 1405. At block 1405, it is determined whether the instances of the vector indexed by indexB have been accounted for in the merged array (B[indexB]·compress<0). All instances of the indexed vector have been accounted for if the compress information has been reduced to less than 0 in this illustrated implementation. If the remaining instance(s) of the vector has been accounted for, then control flows to block 1407. If not, then control flows to block 1409.

Blocks 1403 and 1407 advance the pointers or indexes to a next vector of respective input arrays for merging since the currently indexed vector has already been incorporated into the merged array. At block 1403, indexA is incremented, and the change is recorded (change[0]=1). Control flows from block 1403 to block 1405. At block 1407, indexB is incremented, and the change is recorded (change[1]=1). Control flows from block 1407 to block 1409.

At block 1409, both compressed data arrays are marked a valid contributors (Avalid[1]=1; Bvalid[1]=1).

At block 1410, it is whether either of the indices have changed or whether either of the arrays was not a contributor to the merged array in the preceding iteration (Avalid[0]==0 OR Bvalid[0]==0 OR change[0]==1 OR change[1]==1). If the condition evaluates to true, then control flows to block 1413. If the condition evaluates to false, then control flows to block 1413.

At block 1411, a concatenation of the values in the vector indexed by A[indexA] and the values in the vector indexed by B[indexB] is written into a new vector created for the merged array.

At block 1413, it is determined which of the indexed vectors has fewer remaining instances. The indexed vector with fewer remaining instances will be fully incorporated into the merged array (i.e., exhausted). In this example illustration, the determination is made with evaluating A[indexA]·compress<B[indexB]·compress. If the remaining instance(s) of the vector indexed in array A has fewer remaining instances, then control flows to block 1415. If the remaining instances of the vector indexed in array B has fewer remaining instances (or if the remaining instances between indexed vectors is equal), then control flows to block 1417. If the remaining instances are equal between vectors, either of blocks 1415 and 1417 will reduce the instances for both vectors to less than 0 to indicate complete incorporation of the vectors into the merged array.

At block 1417, the compression information of the new vector of the merged array is increased by the compression information of the indexed row of the array B. The remaining counter is decremented by the compression information of the indexed row of the array B. The compression information of the row indexed by indexA in array A is reduced by the compression information of the row indexed by indexB in array B. This effectively extracts some of the instances of the array A and updates the compression information to indicate remaining instances. The compression information of the indexed row of array B is reduced by itself plus 1, which marks the vector as exhausted. Control flows from block 1417 to block 1217.

At block 1415, the compression information of the new vector of the merged array is increased by the compression information of the indexed row of the array A. The remaining counter is decremented by the compression information of the indexed row of the array A. The compression information of the row indexed by indexB in array B is reduced by the compression information of the row indexed by indexA in array A. This effectively extracts some of the instances of the array B and updates the compression information to indicate remaining instances. The compression information of the indexed row of array A is reduced by itself plus 1, which marks the vector as exhausted. Control flows from block 1415 to block 1217.

The flowcharts of FIGS. 9-14 are intended to aid in understanding the inventor subject matter and are not to limit embodiments or scope of the claims. For instance, the operations to check which array is larger (e.g., blocks 903 and 905) or to determine whether the currently indexed arrays have been exhausted (e.g., blocks 1101 and 1105) can be done in a different order. The relative comparators may be different depending upon how the parameters are implemented to track remaining instances and whether a vector has been exhausted. For example, a vector may be exhausted when the compression information indicates 0 instead of less than 0. The compression information can indicate repeats or instances. If the compression indicates repeats, then compression information will be updated differently than depicted in FIGS. 9-14.

In addition, compressed data arrays can be both re-aligned and merged. Program instructions can re-align compressed input arrays and then merge the re-aligned compressed input arrays. Furthermore, merger of compressed data arrays is not limited to two compressed input arrays. Embodiments can merge together more than two compressed data arrays. Embodiments merge the compressed data arrays in pairs and then merge the resulting merged arrays. Embodiments can traverse all of the compressed data arrays each merge iteration and create ending rows of the merged array in descending size of the compressed data arrays.

Although the example illustrations refer to trace data, embodiments of the inventive subject matter are not so limited. The inventive subject matter can be used for any data set arranged/organized/accessible as a 2-dimensional data set with compression in one of the dimensions. In addition, the description refers to columns and rows to avoid obfuscating the inventive subject matter and aid in understanding the description. Rows and columns can be swapped or described with other labels. Regardless of the particular naming convention or semantics to describe a 2-dimensional data set, the data set can be manipulated while still compressed in accordance with the inventive subject matter. In addition, a particular column or row can instead be referred to as an index into one of the dimensions to untangle unnecessary semantics or labels from the inventive subject matter. To illustrate, a first column or a first row can be identified as a first index into a first dimension. Further, the examples herein refer to compression techniques that count repeats or instances of vector, but embodiments are not so limited. Two-dimensional data arrays compressed in accordance with other lossless compression techniques (e.g., lossless compression using linear feedback shift registers) can also be manipulated as described herein.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 15:
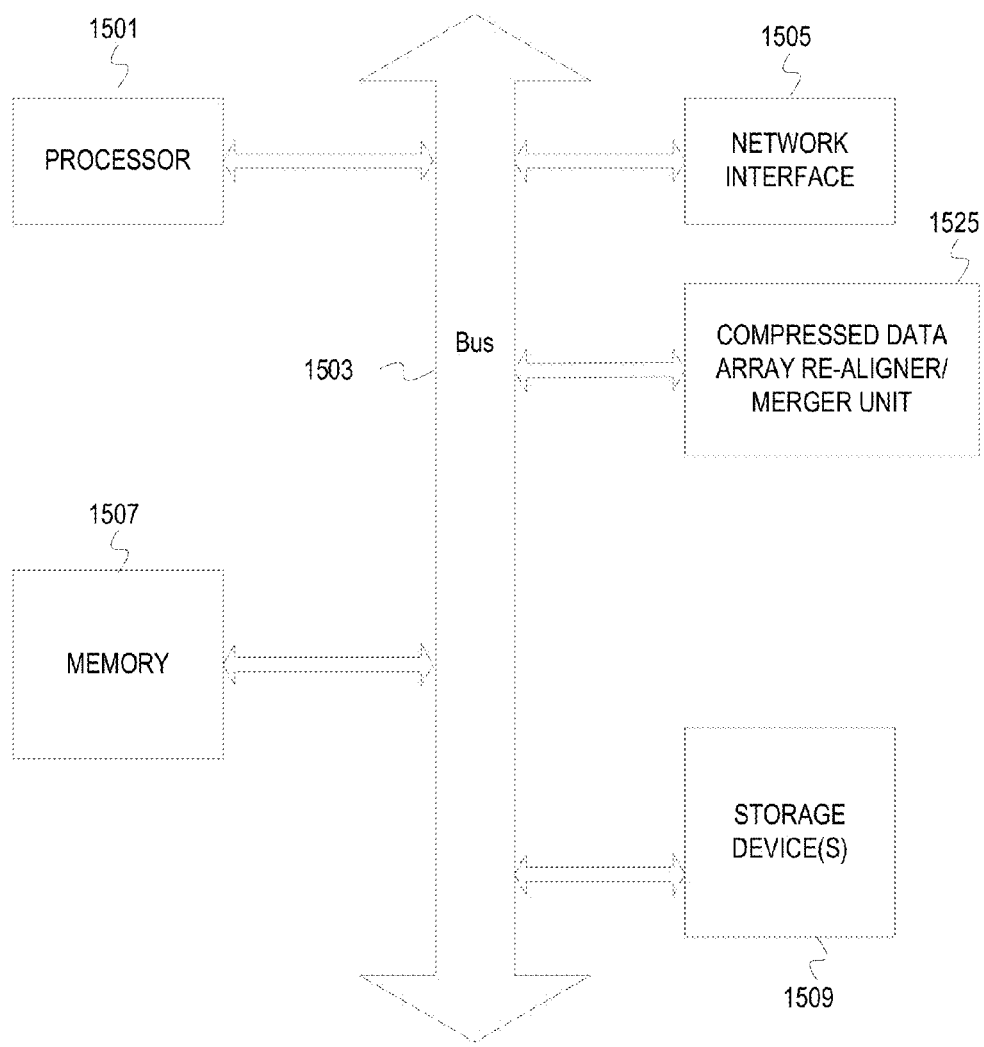
FIG. 15 depicts an example computer system with a compressed data array re-aligner/merger.

FIG. 15 depicts an example computer system with a compressed data array re-aligner/merger. A computer system includes a processor unit 1501 (possibly including multiple processors, multiple cores, multiple nodes, and/or implementing multi-threading, etc.). The computer system includes memory 1507. The memory 1507 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 1503 (e.g., PCI, ISA, PCI-Express, HyperTransport® bus, InfiniBand® bus, NuBus bus, etc.), a network interface 1505 (e.g., an ATM interface, an Ethernet interface, a Frame Relay interface, SONET interface, wireless interface, etc.), and a storage device(s) 1509 (e.g., optical storage, magnetic storage, etc.). The computer system also includes a compressed data array re-aligner/merger 1525 unit. The re-aligner/merger unit 1525 manipulates compressed data arrays as described above. The re-aligner/merger unit 1525 re-aligns a compressed data array while compressed and preserver much of the compression. The re-aligner/merger unit 1525 can also merge compressed data arrays to generate a merged array that preserver much of the compression. The re-aligner/merger unit 1525 can be implemented as separate units, and a system need not implement both re-align and merger. Any one of these functionalities may be partially (or entirely) implemented in hardware and/or on the processing unit 1501. For example, the functionality may be implemented with an application specific integrated circuit, in logic implemented in the processing unit 1501, in a co-processor on a peripheral device or card, etc. Further, realizations may include fewer or additional components not illustrated in FIG. 15 (e.g., video cards, audio cards, additional network interfaces, peripheral devices, etc.). The processor unit 1501, the storage device(s) 1509, and the network interface 1505 are coupled to the bus 1503. Although illustrated as being coupled to the bus 1503, the memory 1507 may be coupled to the processor unit 1501.

While the embodiments are described with reference to various implementations and exploitations, it will be understood that these embodiments are illustrative and that the scope of the inventive subject matter is not limited to them. In general, techniques for re-aligning and/or merging compressed data arrays while preserving the compression as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A computer program product for re-aligning a compressed two-dimensional data set, the computer program product comprising:
    a non-transitory computer readable storage medium having computer usable program code embodied therewith, the computer usable program code comprising a computer usable program code configured to:
    determine a maximum shift value of a set of one or more shift values for re-aligning a two-dimensional data set, wherein each of the set of one or more shift values indicates shifts at a specified index into a first dimension of the two-dimensional data set, wherein the two-dimensional data set is compressed along the first dimension;
    for each second dimension vector of the two-dimensional data set,
        determine whether shifting for each of the set of one or more shift values at the specified index into the first dimension of the second dimension vector results in a different vector than either a previously created vector or the second dimension vector;

if shifting results in the different vector, add the different vector to a re-aligned array;

if shifting does not result in the different vector, incorporate a compressed form of the second dimension vector into the re-aligned data set.

2. The computer program product of claim 1, wherein each of the vectors comprises an ordered set of values.

3. The computer program product of claim 1, wherein sequential repeating instances of a set of values are represented with a single vector and compression information that indicates the repeating instances.

4. The computer program product of claim 1, wherein the different vector indicates no data values or null values at the specified index into the different vector when shifting beyond the two-dimensional data set.

5. The computer program product of claim 1 further comprising computer usable program code configured to write values into a buffer in accordance with the shifting.

6. The computer program product of claim 5, wherein the computer usable program code configured to write values into the buffer in accordance with the shifting comprises the computer usable program code configured to:

for each of the second dimension vectors of the two-dimensional data set, for each position of the vector, write a null value or no data value into a position of the buffer that corresponds to the position of the vector if the position of the vector shifts beyond the two-dimensional data set, write a value at the position of the vector into the corresponding position of the buffer if the position of the vector is not shifted, and write a value at the position of a different vector of the two-dimensional data set into the corresponding position of the buffer if the position of the vector is shifted.

7. The computer program product of claim 6, wherein the computer usable program code configured to add the different vector to the re-aligned array comprises transferring contents of the buffer to the re-aligned array or creating a new vector for the re-aligned array with the contents of the buffer.

8. An apparatus comprising:

a processor; and a compressed data set re-alignment unit operable to, determine a set of one or more shifts and a corresponding set of one or more first dimension indices into a two-dimensional compressed data set for re-aligning the two-dimensional compressed data set;

determine impact of re-aligning upon each vector in the second dimension of the two-dimensional compressed data set while the two-dimensional compressed data set remains compressed; and create new compressed vectors in the second dimension resulting from re-aligning;

modify compression information for each of the original vectors of the two-dimensional compressed data set that remain after re-aligning based, at least in part, on the new compressed vectors; and create a re-aligned version of the two-dimensional compressed data set with the new compressed vectors, and the remaining original vectors with their modified compression information.

9. The apparatus of claim 8 further comprising a machine-readable storage medium having computer usable program code encoded therein, wherein the computer usable program code embodies the compressed data set re-alignment unit.

\* \* \* \* \*